(12) United States Patent
Nassif

(10) Patent No.: US 7,171,333 B2
(45) Date of Patent: Jan. 30, 2007

(54) ON-WAFER METHOD AND APPARATUS FOR PRE-PROCESSING MEASUREMENTS OF PROCESS AND ENVIRONMENT-DEPENDENT CIRCUIT PERFORMANCE VARIABLES FOR STATISTICAL ANALYSIS

(75) Inventor: Sani Richard Nassif, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 11/109,092

(22) Filed: Apr. 19, 2005

(65) Prior Publication Data

US 2006/0235647 A1 Oct. 19, 2006

(51) Int. Cl.
*G06F 11/27* (2006.01)

(52) U.S. Cl. ............... 702/179; 702/117; 702/183; 324/765

(58) Field of Classification Search ........... 702/179, 702/58, 59, 117, 118, 124, 126, 180, 183, 702/185, 187–189

See application file for complete search history.

(56) References Cited

U.S. PATENT DOCUMENTS

| 4,021,656 | A | * | 5/1977 | Caudel et al. ............... 708/139 |
| 4,357,703 | A | * | 11/1982 | Van Brunt .................. 714/733 |
| 6,704,895 | B1 | * | 3/2004 | Swoboda et al. ........... 714/726 |

* cited by examiner

*Primary Examiner*—Hal Wachsman
(74) *Attorney, Agent, or Firm*—Mitch, Harris, Atty at Law, LLC; Andrew M. Harris; Casimer K. Salys

(57) ABSTRACT

An on-wafer method and apparatus for preprocessing measurements of process and environment-dependent circuit performance variables provides new techniques for yield/performance test and analysis. An on-wafer circuit calculates the sums of multiple exponentiations of outputs of one or more measurement circuits, thereby reducing the amount of data that must be transferred from the wafer without losing information valuable to the analysis. An integer scaling of the input data is arranged between zero and unity so that the exponentiations all similarly lie between zero and unity. Measurement value ranges are determined by capturing extreme values using comparators as the measurements are input.

14 Claims, 6 Drawing Sheets

ON-WAFER METHOD AND APPARATUS FOR PRE-PROCESSING MEASUREMENTS OF PROCESS AND ENVIRONMENT-DEPENDENT CIRCUIT PERFORMANCE VARIABLES FOR STATISTICAL ANALYSIS

BACKGROUND OF THE INVENTION

1. Technical Field

The present invention relates generally to integrated circuit test circuits, and more specifically to an on-wafer dedicated measurement data pre-processor circuit.

2. Description of the Related Art

Semiconductor circuit speed and other performance factors are critical limitations in today's processing systems and are predicted to become even more of a critical limitation as technologies move forward. As existing technologies are pushed to their limits, yield and performance analyses and testing become ever more necessary for semiconductor die circuit designs.

Historically, circuit designs have been simulated using programs that predict the performance of the circuits over environmental and process variations. More recently, test circuits have been incorporated either on the die or on the kerf that provide useful information about circuit performance over environmental and process variations. A common circuit that is implemented for testing circuit delays is a ring counter that oscillates at a frequency dependent on the total circuit delay around the ring. Other circuits may be implemented to determine transition times, and other process/environment dependent performance variables.

The output of the above-described circuits is commonly measured with a tester that extracts the needed measurement data from the circuit and performs analytical computation on the extracted measurement data. Typically, a statistical analysis is performed that predicts yield/performance behavior of a given circuit and process. The statistical computations are both input data-intensive and computation intensive.

The bandwidth of the typical tester-wafer connection is limited to approximately 100 Mhz, while present circuits are operating at frequencies approaching 5 Ghz and beyond. If some pre-processing reduction of the measurement data could be performed, the resulting improvement of test and analysis speed would decrease the turn-around time of the measurement and analysis process and/or make it possible to perform deeper analyses in the same time period. However, any data reduction can limit the possible value of the statistical analysis, as each measurement taken is generally relevant to the statistics of each performance variable.

It would therefore be desirable to provide a method and apparatus that reduces measurement/analysis time for process and environment-dependent performance variable wafer tests. It would further be desirable to provide a method and apparatus compatible with currently used statistical techniques, so that no effective loss of analysis input occurs due to the reduction in measurement/analysis time.

SUMMARY OF THE INVENTION

The objective of reducing measurement/analysis time for process and environment-dependent performance variable tests is accomplished in an on-wafer apparatus and method. The apparatus is a circuit that may be incorporated within one or more dies on a wafer, or on the kerf.

The circuit is a dedicated statistical pre-processor that accumulates the direct sum and the sum of higher-order exponentiations of a sequence of measurement values provided by one or more test circuits on the wafer. The statistical moments up to order N can be easily calculated from the accumulated sums by an external system. The circuit thus performs compatible and accurate data reduction before transfer of the circuit output to a tester, resulting in no loss of statistical analysis information.

The circuit receives integer numbers that correspond to a measurement scaling between zero and unity in order to force each measurement's contribution to the exponentiations to also lie between zero and unity. A set of look-up tables provides outputs of appropriate exponential order for each accumulated value, and the exponentiations are accumulated by adder/accumulators.

As an alternative to the look-up tables, another embodiment of the circuit uses multipliers to determine each measurement's contribution to the exponentiations, and can be cascaded to simplify the circuit design.

A set of integer comparators can also be incorporated in the circuit to determine the range of the measurement values by capturing the maximum and minimum values encountered during the test data accumulation.

A histogram memory may also be incorporated to store accumulations of data points for values within a range. The address range for the histogram may be set by a calculation based on the outputs of the range determining circuit.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

Figure 1:
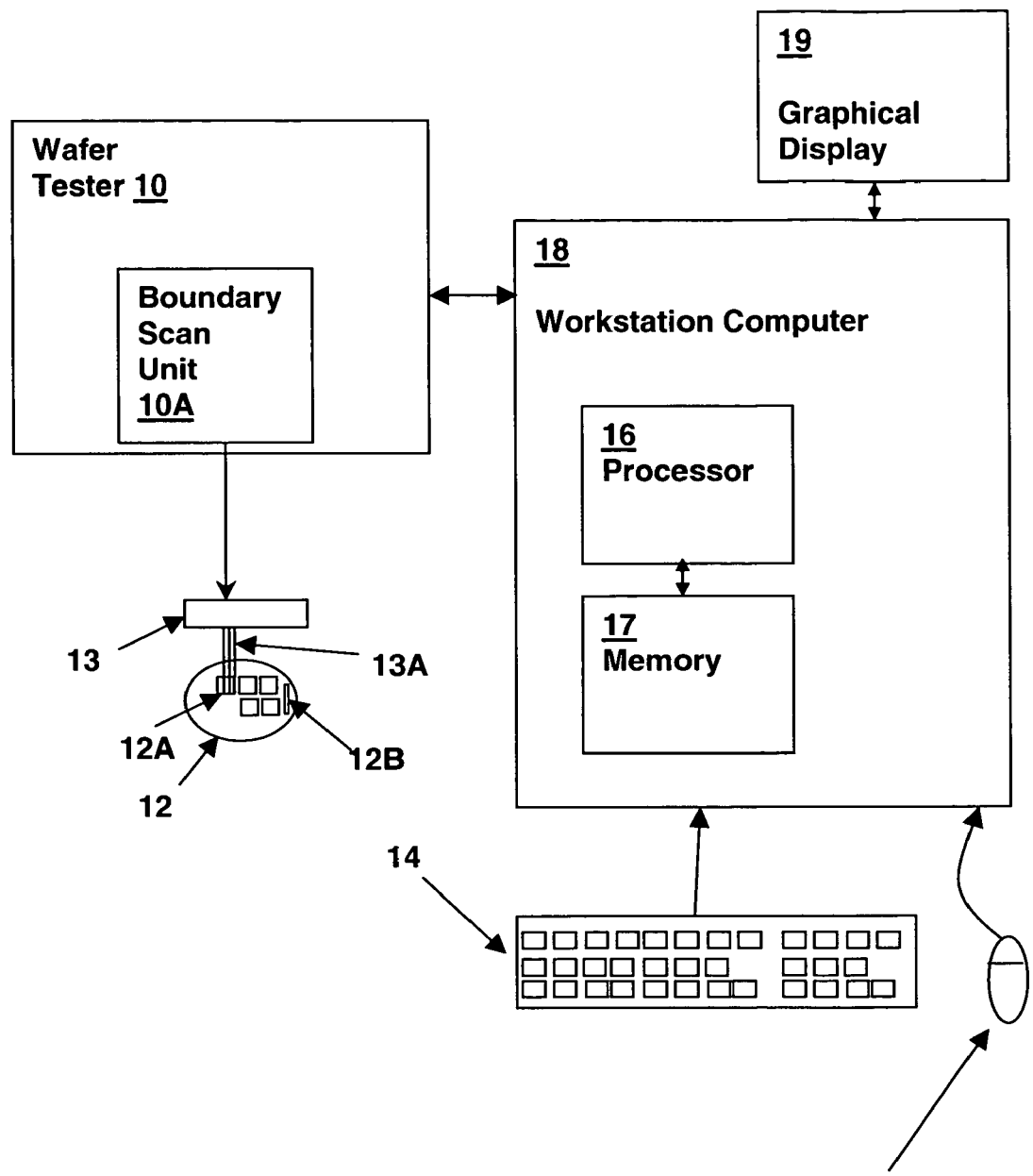
FIG. 1 is a diagram of system in which a method in accordance with an embodiment of the invention is practiced.

Referring to the figures, and particularly to FIG. 1, a VLSI wafer test system, in which methods according to an embodiment of the present invention are performed, is depicted. A wafer tester 10 includes a boundary scan unit 10A for providing stimulus to and retrieving data from a die 12A on a wafer under test 12, via a probe head 13 having electrical test connections 13A to die 12A. A workstation computer 18, having a processor 16 coupled to a memory 17, for executing program instructions from memory 17, wherein the program instructions include program instructions for receiving data produced by circuits within wafer 12 in accordance with an embodiment of the present invention, is coupled to wafer tester 10. The data produced by embodiments of the present invention are reduced forms of measurement data collected from measurement circuits within dies 12A or from measurement circuits 12B embedded in the kerf of wafer 12 (i.e., circuits integrated on portions of wafer 12 that are discarded after singulation of dies 12A.) Another possible source of measurement data is from circuits that are only temporarily constructed on dies 12A and are removed subsequent to final steps in the manufacturing process (e.g., circuits that are implemented with a sacrificial metal layer that is removed subsequent to the test measurements and replaced with a "functional" metal layer).

Data produced by circuits in accordance with embodiments of the invention are transferred to workstation computer 18 via wafer tester 10 and stored in memory 17 and/or other media storage such as a hard disk. Workstation computer 18 is also coupled to a graphical display 19 for displaying program output such as statistical analysis results described hereinafter. Workstation computer 18 is further coupled to input devices such as a mouse 15 and a keyboard 14 for receiving user input. Workstation computer may be coupled to a public network such as the Internet, or may be a private network such as the various "intra-nets" and software containing program instructions for analyzing data produced by methods and circuits in accordance with embodiments of the present invention may be located on remote computers or locally within workstation computer 18. Further, workstation computer 18 may be coupled to wafer tester by such a network connection.

While the system of FIG. 1, depicts a configuration suitable for sequential test of a plurality of dies on a wafer, the depicted system is illustrative and not limiting to the present invention. Probe head 13 may be a multi-die full wafer probe system, or may comprise multiple probe heads for simultaneously testing multiple wafers on a single or multiple die basis. Additionally, while boundary data retrieval and stimulus is illustrated, the techniques of the present invention may also be applied to other interfaces available to probe wafer 12, or applied to circuits implemented in fully functional dies where data extraction is performed over a serial or parallel bus or other interface.

Figure 2A:
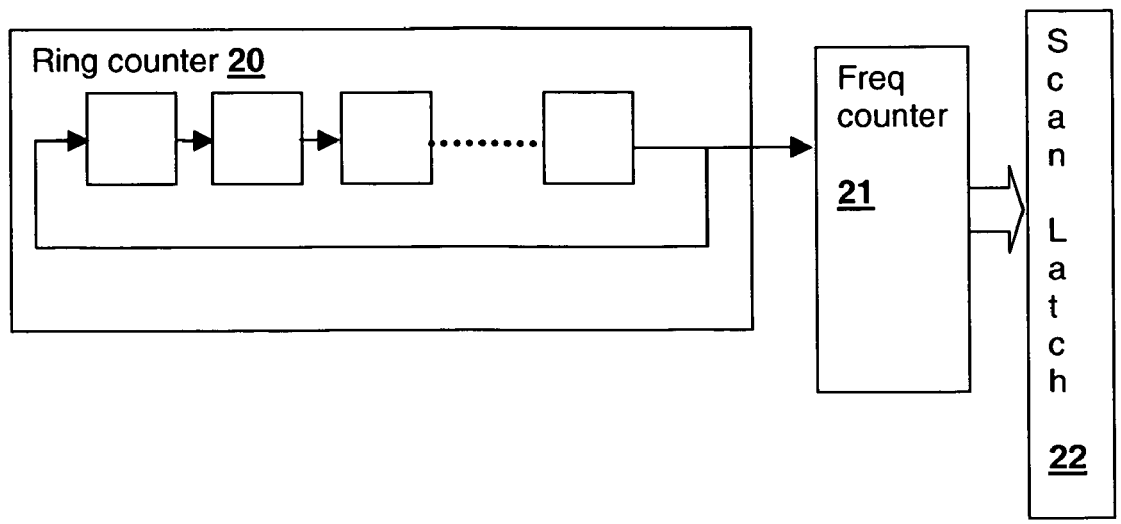
FIGS. 2A and 2B are block diagrams of exemplary measurement circuits that provide input data to circuits in accordance with embodiments of the present invention.
Figure 2B:
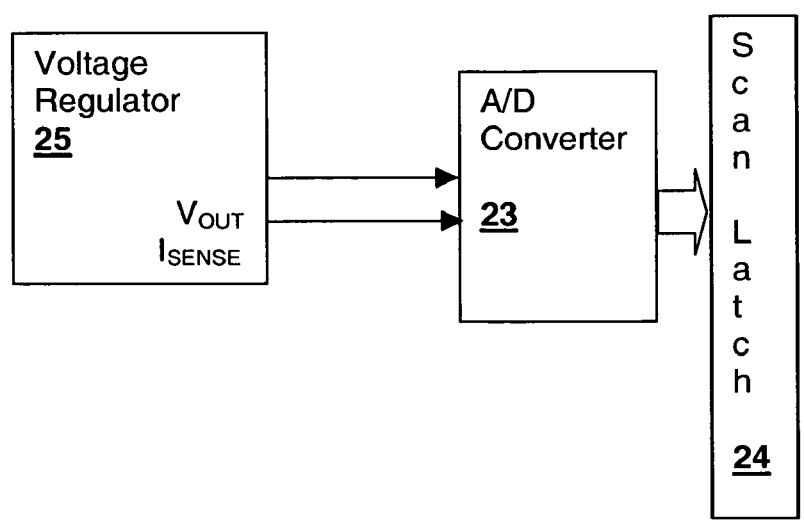

Referring now to FIGS. 2A and 2B, examples of measurement circuits and measurements that can be pre-processed by a circuit and method in accordance with an embodiment of the present invention are shown. FIG. 2A shows a common measurement circuit example that is used to determine delay time. A ring counter 20 includes a large number of stages that may be to determine absolute buffer/inverter delays that set limits on the frequency of operation of circuits built with similar buffers/inverters. The frequency of an output pulse train of ring counter 20 will indicate a sum of stage delays, and variations in frequency will indicate variations in the delay and thus performance of the stages. A frequency counter 21 is used to provide a count value corresponding to a frequency of operation of ring counter 20, and at the end of a test interval, the count of frequency counter is loaded into scan latch 22 (scan latch 22 may be implemented as scannable stages within frequency counter itself). Measurements such as the frequency of ring counter 20 are studied over environmental and over multiple wafers and/or dies to study process variation impact on delay and stability. Generally, a Gaussian analysis is performed over numerous measurements and the resulting distribution yields clues about device yields, optimum operating points and ways in which designs can be improved.

FIG. 2B is an example of an analog measuring circuit that is used to study power supply characteristics. A voltage regulator 25, which is generally a part of a functional die has two outputs that are sensed by an analog-to-digital (A/D) converter 23 so that current consumption and voltage at a power node can be determined and the resultant digital value loaded into scan latch 24. A/D converter may be present in the functional die, temporarily implemented on the die, or located in the kerf. Measurements such as quiescent power plane current measurements (IDDQ measurements) that correlate stimulated states of circuits on a die to current consumption in order to locate defects can be studied via the values in scan latch 24. Any other analog measurement that it is desirable to study over large numbers of measurements can be likewise be input to A/D converter 23 and pre-processed by the circuits and method of the present invention.

The present invention primarily concerns a technique for reducing the bandwidth required over the interface between workstation computer and circuits on wafer 12 (or in isolated dies) to perform statistical evaluation of measurements made within the wafer 12 (or in isolated dies), such as the measurements made by the circuits depicted in FIGS. 2A and 2B. Specifically, with respect to Gaussian analysis, it is possible to express the moments of the Gaussian distribution in terms of summations of exponentiations of the measurement values. If $x_i$ represents the sequence of measurement value, N is the number of measurements in the distribution and $S_1$, $S_2$ and $S_3$ represent the sum, sum of the squares and the sum of the cubes of $x_i$, respectively (over 1 to N), the following expansions can be applied:

TABLE 1

| Moment | Formula | Expanded Formula |
|---|---|---|
| Mean μ | $1/N \sum_{i=0}^{N} x_i$ | $S_1/N$ |
| Variance $\sigma^2$ | $1/N \sum_{i=0}^{N} (x_i - \mu)^2$ | $(S_2 - (2N - 1)\mu^2)/N$ |
| Skew ξ | $1/N \sum_{i=0}^{N} ((x_i - \mu)/\sigma)^3$ (for large N) | $(S_3 - 3MS_2 + (3N - 1)M^3)/N\sigma^3$ |

From the table above, it is observed that it is only necessary to compute an additional sum of an exponentiation (or just the sum for the mean) of the measurement values for each moment of increasing order, as all other terms have been determined for lower-order moments. Higher-order moments, e.g. kurtosis can also be similarly expanded and will depend on summations of higher-order exponentiations of the measurement values (and the lower-order values already computed).

Figure 3:
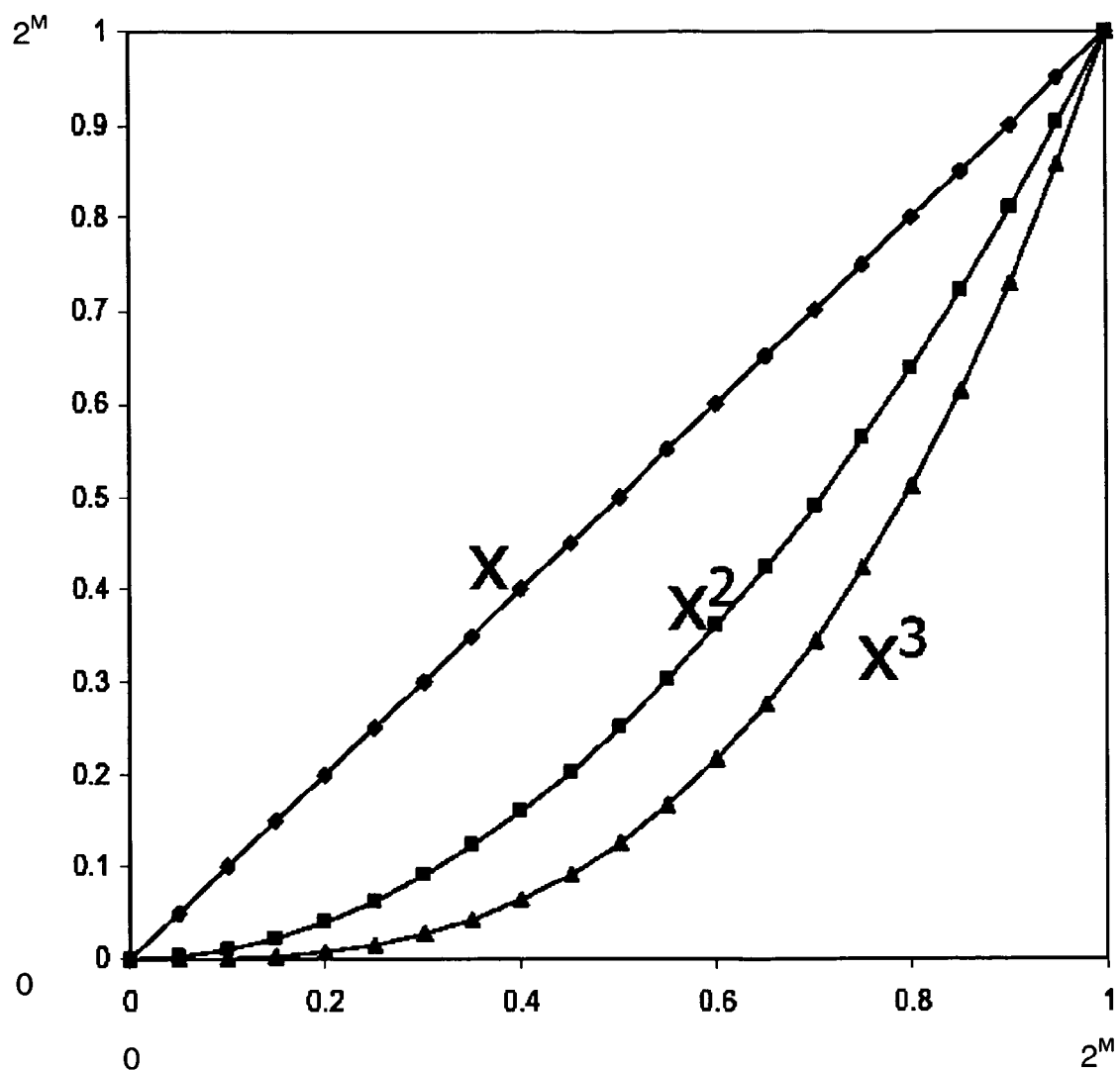
FIG. 3 is a graph showing a scaling used in embodiments of the invention.

Referring now to FIG. 3, a normalization that makes the above computations practical in a dedicated pre-processor circuit is depicted. Because each higher-order moment requires a higher-order exponentiation, floating point operations would generally be required for arbitrary measurement input values. However, in the present invention, the input measurement values are prescaled or pre-arranged by design so that all measurement values are positive integer numbers corresponding to a value between zero and unity. Therefore, the higher-order exponentiations also lie between zero and unity and can be approximated by integer operations having a finite number of bits. The graph of FIG. 3 illustrates the first three powers of X, and show a normalized expression between zero and unity as mapped across measurement values (x-axis) from 0 to $2^M$ where M is the number of bits in the number used to represent the measurement and exponential input to the accumulations of the measurement data and the exponentiations. The left side of the graph (y-axis) is also shown as normalized from 0 to $2^M$, but the measurement value in to exponentiation value out may be expressed by a different number of bits, depending on the tolerable error in the expression of the exponentiated values.

Figure 4:
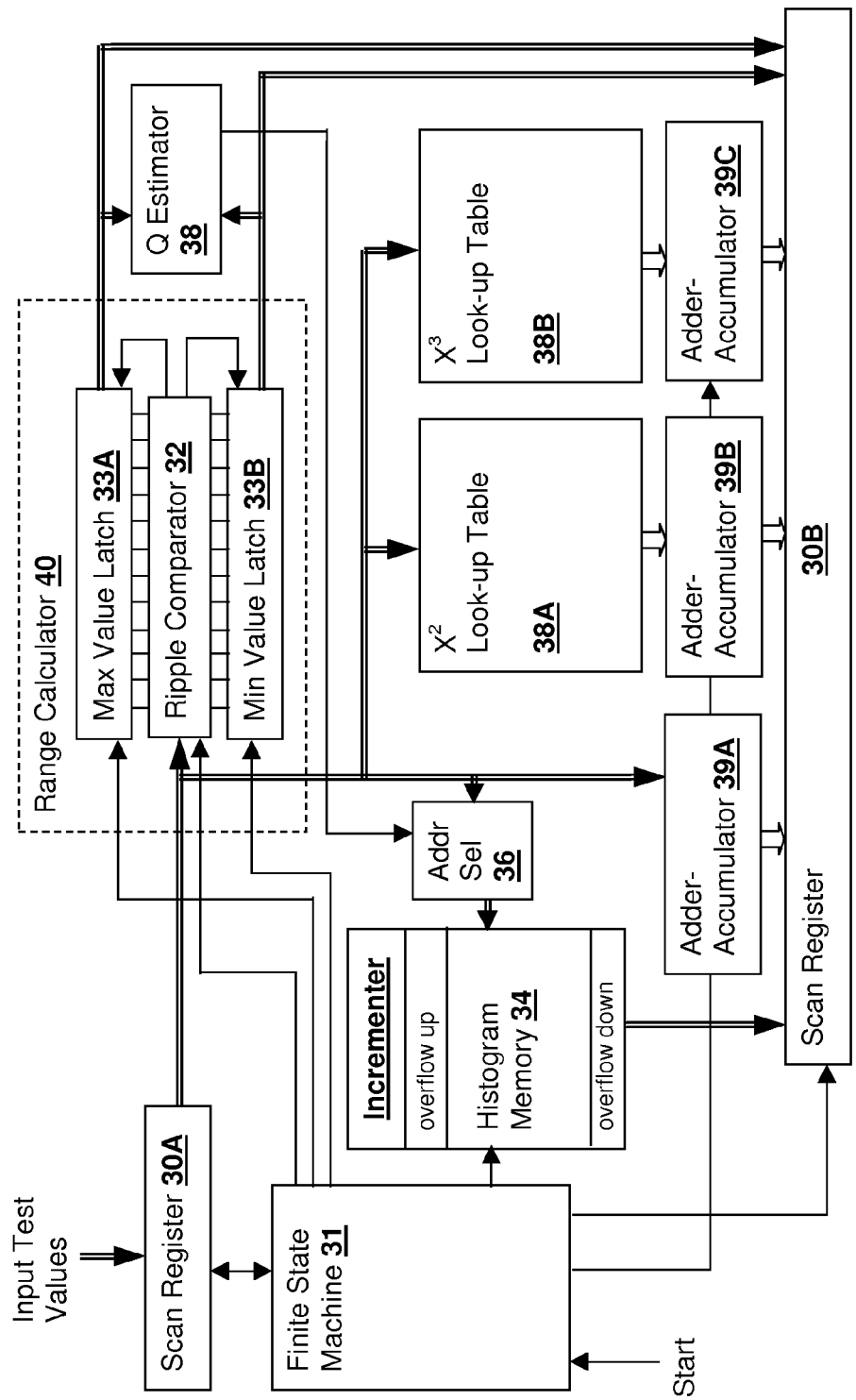
FIG. 4 is a block diagram of a circuit in accordance with an embodiment of the present invention.

Referring now to FIG. 4, a pre-processing circuit in accordance with an embodiment of the present invention is shown. The circuit will generally be implemented either on the kerf of a wafer and used during the testing of the wafer in order to assess the overall performance and its variability.

Input test values (such as those produced by the circuits of FIGS. 2A and 2B) are received in scan register 30A. The operation of the depicted circuit is controlled by a finite state machine 31 that controls sequencing of the circuit to pre-process the sequence of measurement values received in scan register 30A. A Start signal is provided to cause finite state machine 30A to begin pre-processing when the sequence of measurement values commences. The measurement values are provided to an adder-accumulator 39A that accumulates the total of the measurements (for computing the mean) and two look-up tables 38A and 38B that produce the square and cube of each measurement value by using the measurement value as a index. Adder-accumulators 39B and 39C accumulate the sum-of-squares (for computing the variance) and the sum-of-cubes (for computing the skew), respectively. At the end of a measurement cycle, the values in adder-accumulators 39A–39C are provided to scan register 30B, which can then be scanned by the system of FIG. 1 to retrieve the pre-processed measurement accumulations. As a result, a large number of measurements can be performed at clock frequencies available at a die, and only a small resulting data set need be scanned via a wafer probing system.

The circuit as described above is capable of yielding the placement and shape of the distribution to third-order, and with the addition of other higher-order look-up tables and adder-accumulators, can be extended to provide more shape data for the distribution via higher-order moment computation from the resulting accumulations. Once the accumulated exponentiations and measurement sum have been retrieved, the computations shown in Table 1 can be performed by an external system, with a minimum of input data required from the wafer.

Further information is provided to an external system from the circuit by incorporating a range calculator or min/max measurement capture circuit 40. A ripple comparator 32 compares each measurement value with a stored maximum measurement value stored in a latch 33A and a minimum measurement value stored in a latch 33B. If a new maximum or minimum is found, the new value is stored in a corresponding one of latches 33A or 33B. The latch values are output through scan register 30B (which is generally present only for illustration as latches 33A and 33B can be made part of a scan chain). Latches 33A and 34B are set equal to the first measurement value by finite state machine 31 at the beginning of the measurement cycle, so that the range is accurately captured at the end of the measurement cycle. A circuit that computes the actual range (max-min) may be employed within the circuit such as within Q estimator 38 and the range value may be scanned out, but generally the scanning of the maximum and minimum values is sufficient to determine the range of measurements at an external processing system, and represents a trivial additional data transfer burden.

Another feature that can be included in the circuit of FIG. 4 is a histogram memory 34. A histogram is another compact data object that provides useful information about the relative frequencies of data measurement values that are not revealed just by a distribution curve. Histogram memory 34 includes an incrementer 35 that adds one to a location addressed by a number selected from a field of the current measurement value by an address selector 36. Q estimator 38 determines a field of non-constant bits in the measurement values from the results of a range calculation during a prior cycle of measurement. (In order to incorporate histogram measurement, finite state machine 31 is designed to operate in two passes, the first to calculate the range, measurement sum and exponentiation sums, and the second to obtain the histogram.) Once the range of values is known, Q estimator 38 selects the bits to apply from the measurement (essentially all the bits from the highest order "1" bit in the range value down to the width of the address input of histogram memory 34. Alternatively, this is all of the bits from the first differing bit between the values in latch 33A and 33B down to the width of the address input of histogram memory 34). Thus, for each measurement value, a unique or quasi-unique location in histogram memory 34 is incremented to provide a frequency count for each measurement value. (If there is insufficient resolution in histogram memory 34 to accommodate each measurement value in the total range with an individual location, then adjacent measurement values will overlap in a location). After the second pass of the measurement cycle, the values in histogram memory 34 can be scanned out through scan register 30B. Overflow values are maintained at the ends of histogram table, so that a count is maintained of values that do not fit in the range selected by address selector 36.

Figure 5:
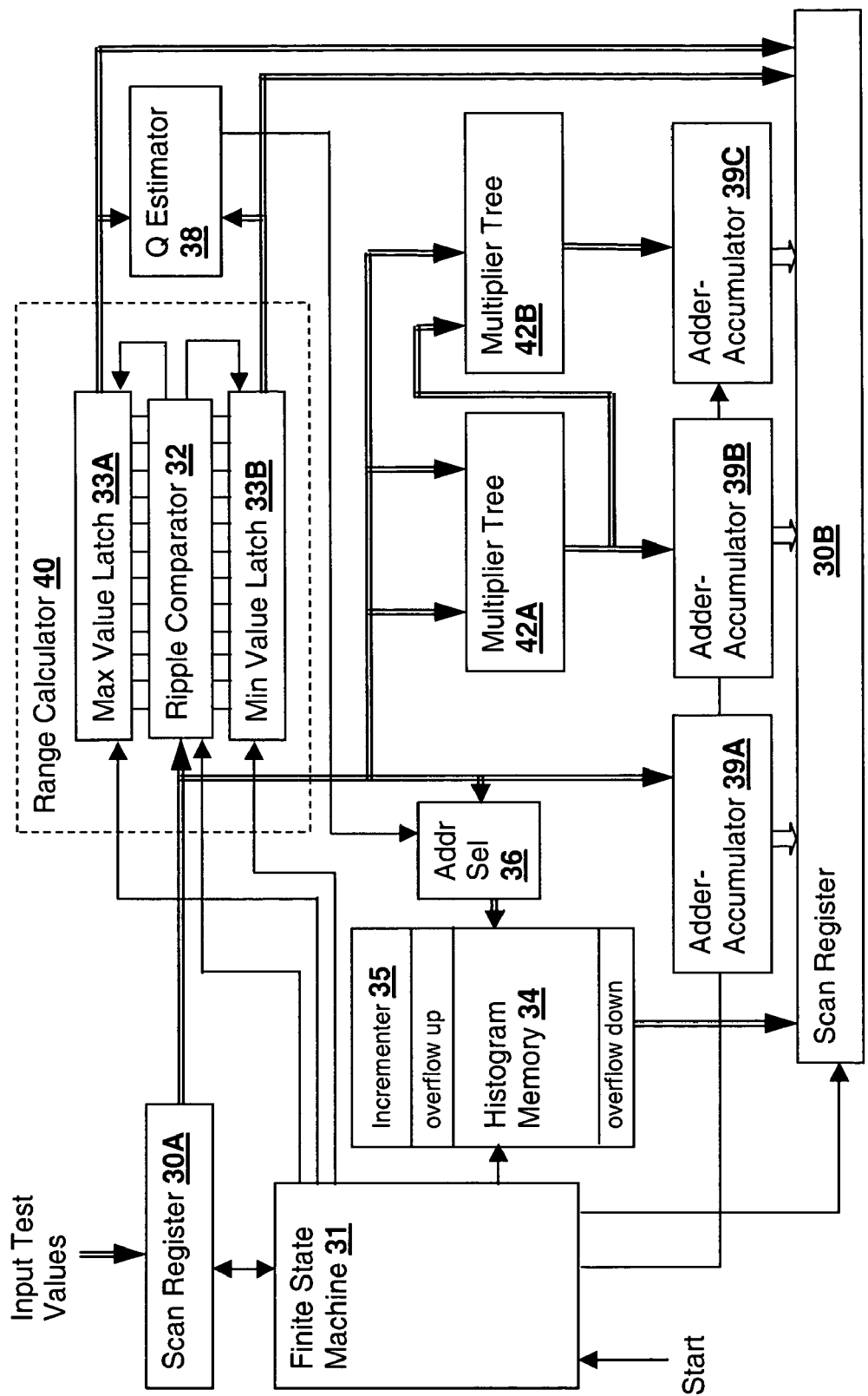
FIG. 5 is a block diagram of a circuit in accordance with another embodiment of the present invention.

Referring now to FIG. 5, a circuit in accordance with another embodiment of the present invention is shown. The circuit of FIG. 5 is very similar to the circuit of FIG. 4 as described above, so only differences in operation and structure will be described below. Instead of the look-up tables used in the circuit of FIG. 4, the circuit of FIG. 5 uses multipliers to achieve the same result. A first multiplier tree 42A multiplies each measurement value by itself to compute the square, which is then accumulated by accumulator-adder 39B. A second multiplier tree 42B multiplies the square received from multiplier tree 42A by the measurement value to compute the cube, which is accumulated by adder-accumulator 39C. More multipliers can be added to compute higher-order exponentiations for use in computing higher-order moments and can be connected serially as shown, or alternatively make use of combinations or perform squaring functions on selected lower-order measurement exponentiations and/or the measurement value to achieve the desired exponentiation (e.g., a third multiplier could square the output of multiplier 42A or multiply the output of multiplier 42B with the measurement value to attain the same result).

Figure 6:
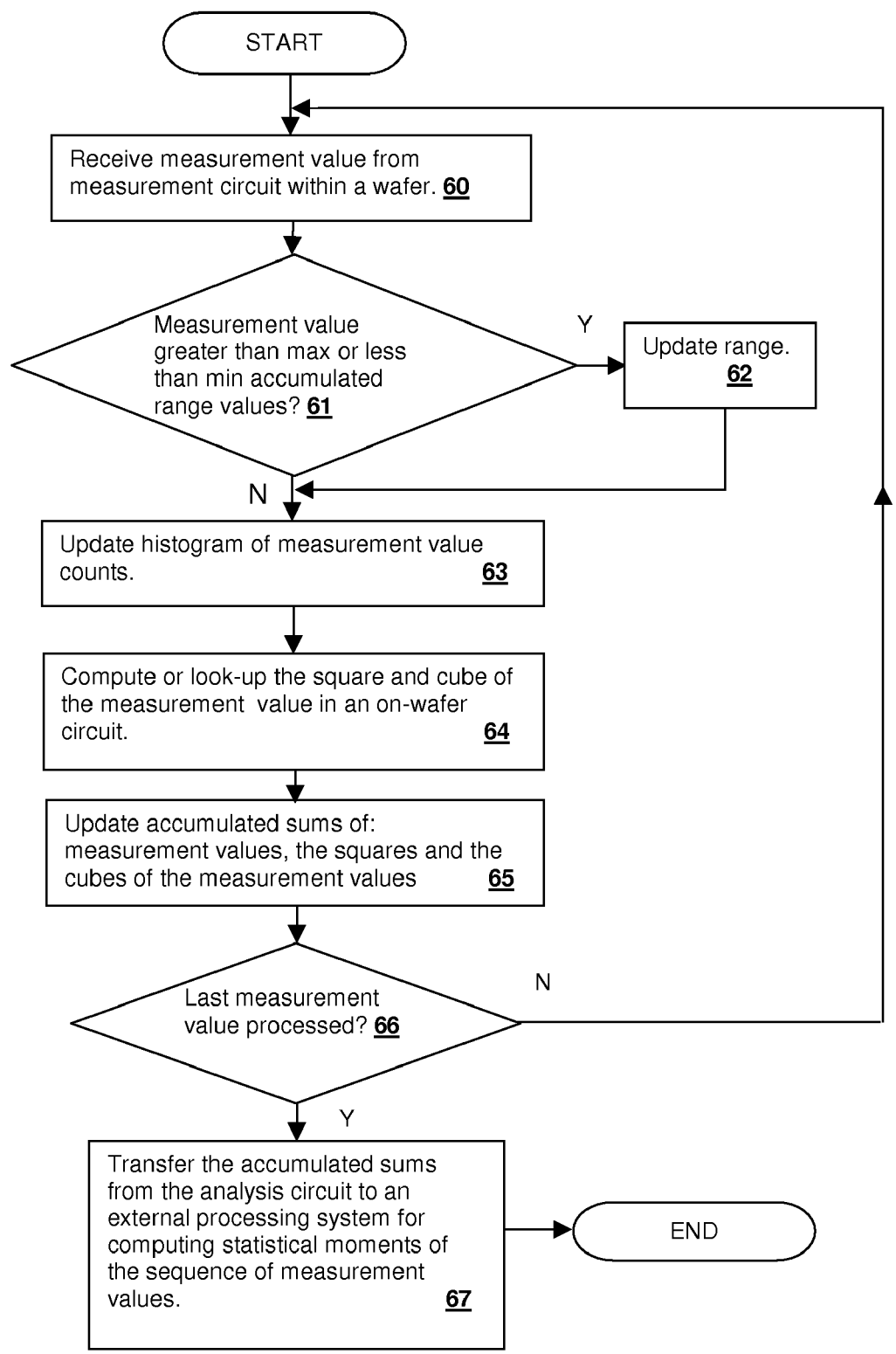
FIG. 6 is a flowchart depicting a method in accordance with an embodiment of the present invention.

Referring now to FIG. 6, a flowchart depicting a method in accordance with an embodiment of the present invention as performed in the circuits and system described above, is shown. As each measurement is received (step 60), if the measurement value is greater than the value stored in max value latch 33A or less than the value stored in mm value latch 33B as determined by ripple comparator 32 (decision 61), the range is updated (step 62). The histogram of measurement value counts in histogram memory 34 is also updated (step 63). The square and cube of the measurement value are calculated by multiplier trees 42A and 42B or determined from look-up tables 38A and 38B (step 64) and the sums of the measurement values, the squares and cubes in accumulators 39A–39C are updated (step 65). If the last measurement value has not been processed, the steps from 60–66 are repeated. Once all of the measurement values have been processed, the accumulated sums are transferred from the analysis circuit to the external processing system for computing the statistical moments of the measurement values and the histogram data is also transferred (step 67).

In summary, the circuits of FIGS. 4 and 5 are capable of providing all of the input values necessary to compute the sums required to calculate the characteristic moments that describe a distribution, they also produce the range (minimum and maximum) as well as a frequency histogram, which are the three statistical data types generally used to evaluate wafer measurement values. While it is possible to incorporate further computation capability to yield the final statistical moments, such is not generally necessary or desirable, as the data set has been sufficiently reduced by the action of the present invention, and wafer test systems can easily calculate the moments from the provided data.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method for pre-processing performance variable measurements of a wafer for use in subsequent statistical analysis, said method comprising:
   receiving a sequence of measurement values from a measurement circuit within said wafer;
   first accumulating, within an analysis circuit within said wafer, a sum of said sequence of measurement values;
   second accumulating, within said analysis circuit, a second sum of squares of each of said sequence of measurement values;
   third accumulating, within said analysis circuit, a third sum of cubes of each of said sequence of measurement values; and
   reading an output of said analysis circuit to transfer a result of each of said first, second and third accumulating to an external processing system for computing statistical moments of said sequence of measurement values.

2. The method of claim 1, further comprising:
   determining within said analysis circuit, for each of said measurement values, whether or not each measurement value is greater than a stored maximum measurement value or less than a stored minimum measurement value;
   responsive to determining that a given measurement value is greater than said stored maximum measurement value, replacing said stored maximum measurement value with said given measurement value;
   responsive to determining that a given measurement value is less than said stored minimum measurement value, replacing said stored minimum measurement value with said given measurement value, and wherein said reading further reads said stored minimum measurement value and said stored maximum measurement value for determining a range of said measurement values in said external processing system.

3. The method of claim 2, further comprising for each of said measurement values, incrementing a histogram table value selected from a histogram table in conformity with each measurement value to accumulate a number of histogram counts within said analysis circuit for each measurement value encountered within said sequence of measurement values, and wherein said reading further reads said histogram counts for providing histogram data to said external processing system.

4. The method of claim 3, further comprising selecting a partial field of each of said measurement values in conformity with said stored maximum and said stored minimum measurement values to scale a range of said measurement values to an address range of said histogram table.

5. The method of claim 1, further comprising for each of said measurement values, incrementing a histogram table value selected in conformity with each measurement value to accumulate a number of histogram counts within said analysis circuit for each measurement value encountered within said sequence of measurement values, and wherein said reading further reads said histogram counts for providing histogram data to said external processing system.

6. The method of claim 1, further comprising extracting integer values from look-up tables within said analysis circuit that are indexed by said sequence of measurement values for determining a square and a cube of each measurement value, and wherein said second and third accumulating accumulate corresponding ones of said extracted integer values.

7. The method of claim 1, further comprising:
   multiplying each measurement value by itself within said analysis circuit to obtain a square of said measurement value; and
   multiplying said square by said each measurement value within said analysis circuit to obtain a cube of said measurement value, and wherein said second accumulating accumulates each square and said third accumulating accumulates each cube.

8. A circuit disposed on a wafer for pre-processing performance variable measurements from another circuit on said wafer for subsequent statistical analysis by an external processing system, said circuit comprising:
   a register for receiving a sequence of measurement values from a measurement circuit;
   a first accumulator for accumulating a first sum of said sequence of measurement values;
   a second accumulator for accumulating a second sum of squares of said sequence of measurement values;
   a third accumulator for accumulating a third sum of cubes of said sequence of measurement values; and
   an interface for transferring each of said first sum, said second sum, and said third sum from said accumulators to said external processing system for computing statistical moments of said sequence of measurement values.

9. The circuit of claim 8, further comprising a range calculator for determining and storing a maximum and a minimum value of said sequence of measurement values, and wherein said range calculator is coupled to said interface for transferring information corresponding to a range of said sequence of measurement values to said external processing system.

10. The circuit of claim 9, further comprising a histogram table for storing a number of histogram counts for each measurement value encountered within said sequence of measurement values, and wherein said histogram table is coupled to said interface for providing histogram data to said external processing system.

11. The circuit of claim 10, further comprising a selector for selecting a partial field of each of said measurement values in conformity with said stored maximum and said stored minimum measurement values to scale a range of said measurement values to an address range of said histogram table.

12. The circuit of claim 8, further comprising a histogram table for storing a number of histogram counts for each measurement value encountered within said sequence of measurement values, and wherein said histogram table is coupled to said interface for providing histogram data to said external processing system.

13. The circuit of claim 8, further comprising a plurality of look-up tables having an address input supplied by said sequence of measurement values and a data output coupled to an associated one of said second and third accumulators, wherein said look-up tables store numbers corresponding to squares and cubes of said address input, normalized for an address range representing a positive fraction between zero and one.

14. The circuit of claim 8, further comprising:
a first multiplier for multiplying each measurement value by itself to obtain a square of said measurement value; and a second multiplier for multiplying said square by said each measurement value to obtain a cube of said measurement value, and wherein said second accumulator is coupled to an output of said first multiplier for accumulating each square and said third accumulator is coupled to an output of said second multiplier for accumulating each cube.

* * * * *